United States Patent
Tsung-Kuei et al.

(10) Patent No.: US 6,793,836 B2
(45) Date of Patent: Sep. 21, 2004

(54) PUDDLE ETCHING METHOD OF THIN FILM BY USING SPIN-PROCESSOR

(75) Inventors: Kang Tsung-Kuei, Hsinchu (TW); Hsieh Yue Ho, HsinChu (TW); Chih-Cheng Wang, HsinChu (TW); Hsiao Shih-Yi, Taibau (TW)

(73) Assignee: Grand Plastic Technology Corporation, Hsinchu Industrial Park (TW)

( * ) Notice: Subject to any disclaimer, the term of this patent is extended or adjusted under 35 U.S.C. 154(b) by 196 days.

(21) Appl. No.: 10/190,456

(22) Filed: Jul. 5, 2002

(65) Prior Publication Data

US 2003/0196986 A1 Oct. 23, 2003

(51) Int. Cl.⁷ .............................. B44C 1/22; B08B 3/00
(52) U.S. Cl. ........................ 216/83; 216/88; 134/1.3; 134/22.18; 134/26; 134/33; 134/36
(58) Field of Search .................... 216/83, 88; 134/1.3, 134/22.18, 26, 33, 36

(56) References Cited

U.S. PATENT DOCUMENTS

| | | | | |
|---|---|---|---|---|
| 5,476,816 A | * | 12/1995 | Mautz et al. | 438/622 |
| 5,896,875 A | * | 4/1999 | Yoneda | 134/102.3 |
| 5,897,982 A | * | 4/1999 | Shibata et al. | 430/311 |
| 6,270,949 B1 | * | 8/2001 | Faure et al. | 430/329 |
| 6,329,300 B1 | * | 12/2001 | Yamamoto | 438/745 |

* cited by examiner

Primary Examiner—Nadine G. Norton
Assistant Examiner—Shamim Ahmed
(74) Attorney, Agent, or Firm—Perkins Coie LLP

(57) ABSTRACT

The present invention discloses a puddle etching method of thin film. In a spin etching equipment, pre-wet the wafer by D.I. water and etch solution to remove the contamination and the upper layer of the film on the wafer. Then spin slowly (about 0–50 rpm) and inject etching solution to form a puddle of etching solution which will stay on the wafer, the wafer then keep spin slowly (about 0–50 rpm) such that the puddle of etching solution stay on the wafer and etching is going on by puddle etching. After the thin film is etched, the wafer is spin at higher speed, and D.I. water is injected to rinse. Then, IPA is used to remove the D.I. water by Marangoni effect. Finally raise the speed to dry the wafer.

6 Claims, 3 Drawing Sheets

PUDDLE ETCHING METHOD OF THIN FILM BY USING SPIN-PROCESSOR

BACKGROUND OF THE INVENTION

1. Field of the Invention

The present invention relates to a wet etching method of semiconductor processing, and more particularly, to a method for wet etching of thin film by forming a puddle of etching solution on the wafer in a spin processor

2. Description of Relative Prior Art

In semiconductor processing, batch wet etching or spin etch by using a single wafer spin processor is usually used to etch different kinds of thin film such as silicon dioxide, silicon nitride, silicon oxynitride, poly silicon, metal film, metal-silicide film, etc. The batch method do not suitable to large diameter wafers, the single wafer spin etch is suitable to diameter above 8 inches. However, supplying etching solution to the spinning wafer will waste a lot of etching solution, the uniformity is not good enough, the reason is that the staying time of the etching solution on the center and on the periphery of the wafer is different.

Using dry etching has high value of equipment and special gas problem, and dry etching is not suitable if isotropic or selective etching is required. So it needs an etching method to eliminate the consumption of etching solution, to has high uniformity, and to increase the etch rate but still keep all the advantages of wet etching.

SUMMARY OF THE INVENTION

It is an object of the present invention to provide a single wafer wet etching method with increasing etch uniformity, the uniformity is better than supplying etching solution during the wafer is spinning at high speed.

Another object of the present invention is to provide a single wafer wet etching method with less etching solution consumption, as a large quantity of etching solution is cut down, it still keep the etching capability. The third object of the present invention is to provide a single wafer wet etching method with higher etching rate as compare to spin etching.

To achieve this and other advantages and in accordance with the purpose of the present invention, the present invention make use of a spray and spin etch processor to form a puddle of etch solution on the wafer or substrate and keep the wafer spin in a very low speed (for example 10 rpm), so that the etch solution will stay on the wafer uniformly but will not leaving the wafer and etching can be carried out, the etching solution will have sufficient time to contact with the thin film which is not protected by photoresist or etch mask. After etching, the etch solution is then spin off with high speed, then spin rinsing with D.I. water. The etch rate is better than spin etch and the uniformity is also better.

The puddle etching method of the present invention comprising the following steps: (1) Put the wafer into a spin processor, then spin with 800–1200 rpm for 1 sec.;(2) Spin with 800–1200 rpm to pre-wet the wafer for 10–20 sec.;(3) Inject etching solution from the front side and back side rinse (BSR) with an injection rate of 600 cc/min and spin with 800–1200 rpm to remove the thin film on the surface of the wafer for 10–20 min;(4) Stop injection of etch solution, spin with 800–1200 rpm to remove the etching solution for 1 sec.;(5) Form puddle of etching solution by injected etching solution, in the present embodiment, silicon dioxide film is etched by using diluted HF (DHF, HF:H$_2$O=1:100) solution, with flow rate of 0.6–5 l/min for 3 sec., which is depend on the size of the wafer, larger wafer need more solution, the spin speed of the wafer is kept in 0–50 rpm to keep the solution stay on the wafer, too fast may loose part of the solution, but without spin may result non-uniformity; (6) Keep the wafer spin with 0–50 rpm, the better is 15 rpm, to keep the solution not fry away from the wafer, but may not stop spinning, and should be spin slowly to keep the solution stay on the wafer uniformly to perform puddle etching, the etching time is depended on the thickness of the thin film; (7) Speed up to 800–1200 rpm, inject D.I. water from the front side and BSR to rinse for 20–25 sec.; (8) Stop supplying D.I. water on both the front side and BSR, pre-spin with 600–1000 rpm for 1 sec. to spin off the D.I. water; (9) Inject IPA, the speed is slowed down to 40–100 rpm for 1.5 sec. By using Marangoni effect to make the wafer more clean; (10) Speed up to 1000–2000 rpm for 2 sec. to pre-dry the wafer; (11) Speed up to 3000 rpm or more for 20 sec, to dry the wafer completely.

DETAILED DESCRIPTION OF THE PREFERED EMBODIMENT

Preferred embodiment of the present invention will now be explained with reference to the accompanying drawings. The preferred embodiment of the present invention made use of etching silicon dioxide as an example by using a spin processor of UFO-200 made by Grand plastic Technology Corporation to perform the puddle etching.

Figure 1:
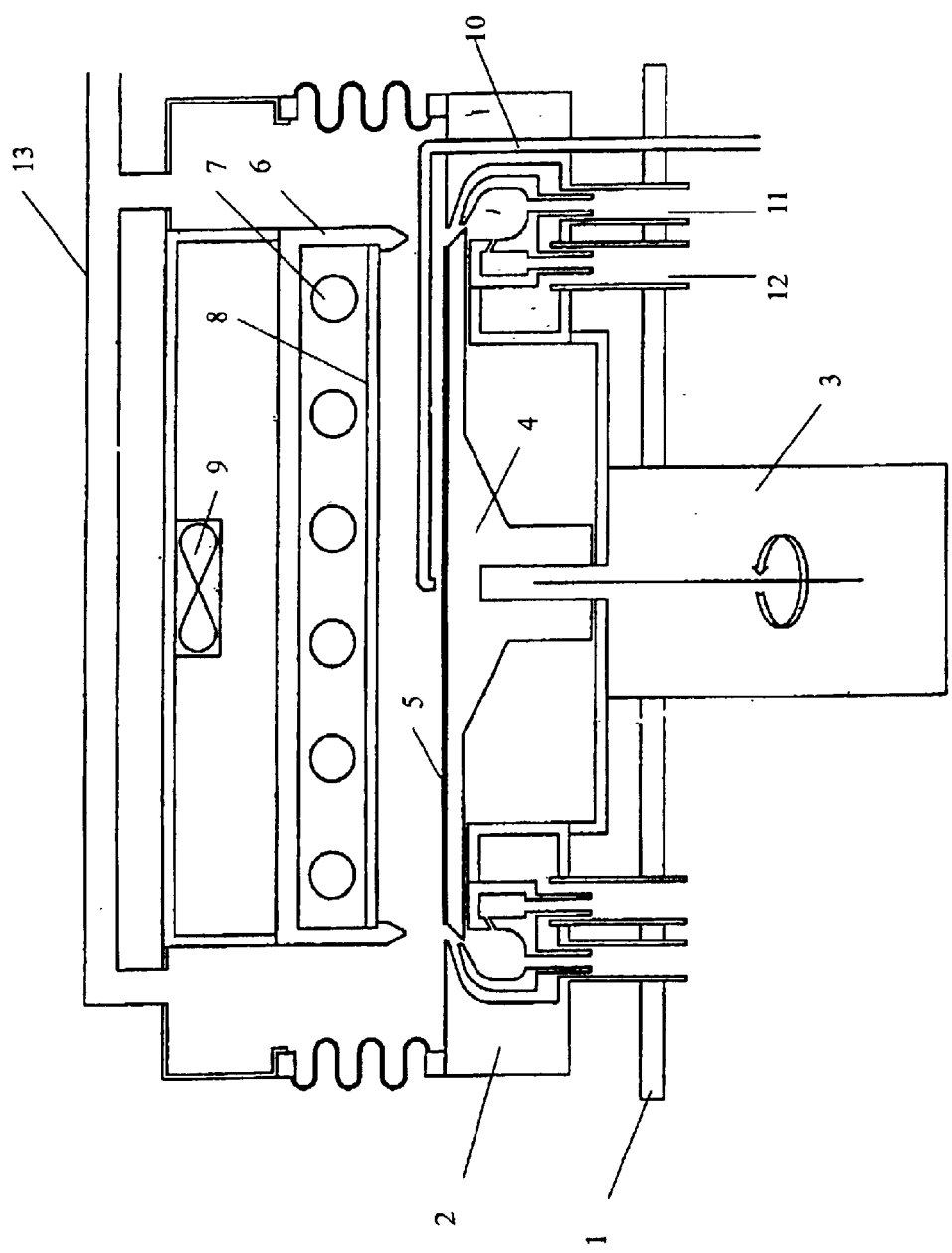
FIG. 1 is a cross section view of a spin processor of a prior art with the heating lamps raised up so that the injection pipe can go to the front side of the wafer.
Figure 2:
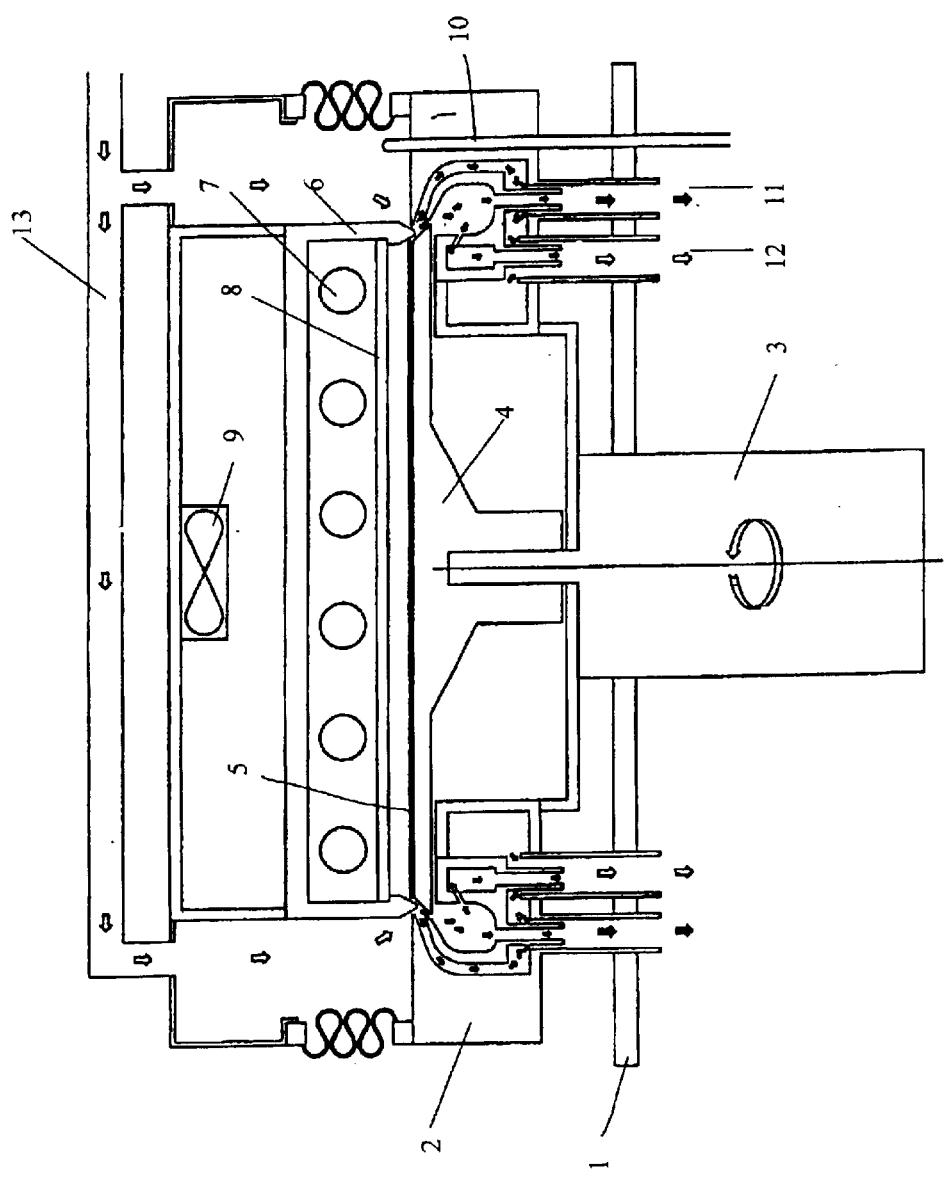
FIG. 2 is a cross section view of a spin processor of a prior art after the injection pipe leaving the wafer and the heating lamps lower down.

Refer to FIG. 1 which is a cross section view of a spin processor of a prior art with the heating lamps 7 raised up so that the injection pipe can go to the front side of the wafer, but do not limited on this type, any spin rinse or spin etch processor can be used equivalently. In FIG. 1, a base 1 is a fixed base for supporting the hole processor, an etching chamber 2 is a cylinder or square vacuum chamber, a wafer chuck 4 can be a vacuum chuck or a electric chuck for holding a wafer 5, the wafer chuck can be drove to spin by a motor 3, the spin speed can be adjusted from 0–3000 rpm. An etching solution injection pipe 10 is above wafer 5 for supplying D.I. water or etching solution when wafer 5 is spinning, a back-side-rinse (BSR) pipe (not shown) supply from the backside. Pipe 10 may move to one side so that the heating lamp housing 6 can lower down as shown in FIG. 2, so that temperature can be adjusted during etching and the etching solution may not fly away. Heating lamps 7 in the heating lamp housing 6 heats the wafer rapidly to a controlled temperature. The light shines through a quartz window 8 on the wafer 5. A fan 9 make the thermal-air flow, Out-side the heating lamp housing 6 clean air or nitrogen is fed through for cooling the etching chamber and prevent the etching vapor to be etched. The air exhaust from an exhausted-pipe-line 12 to a waste gas treatment device (not shown), and the used etching solution is flown to a waste-water treatment device (not shown).

Figure 3:
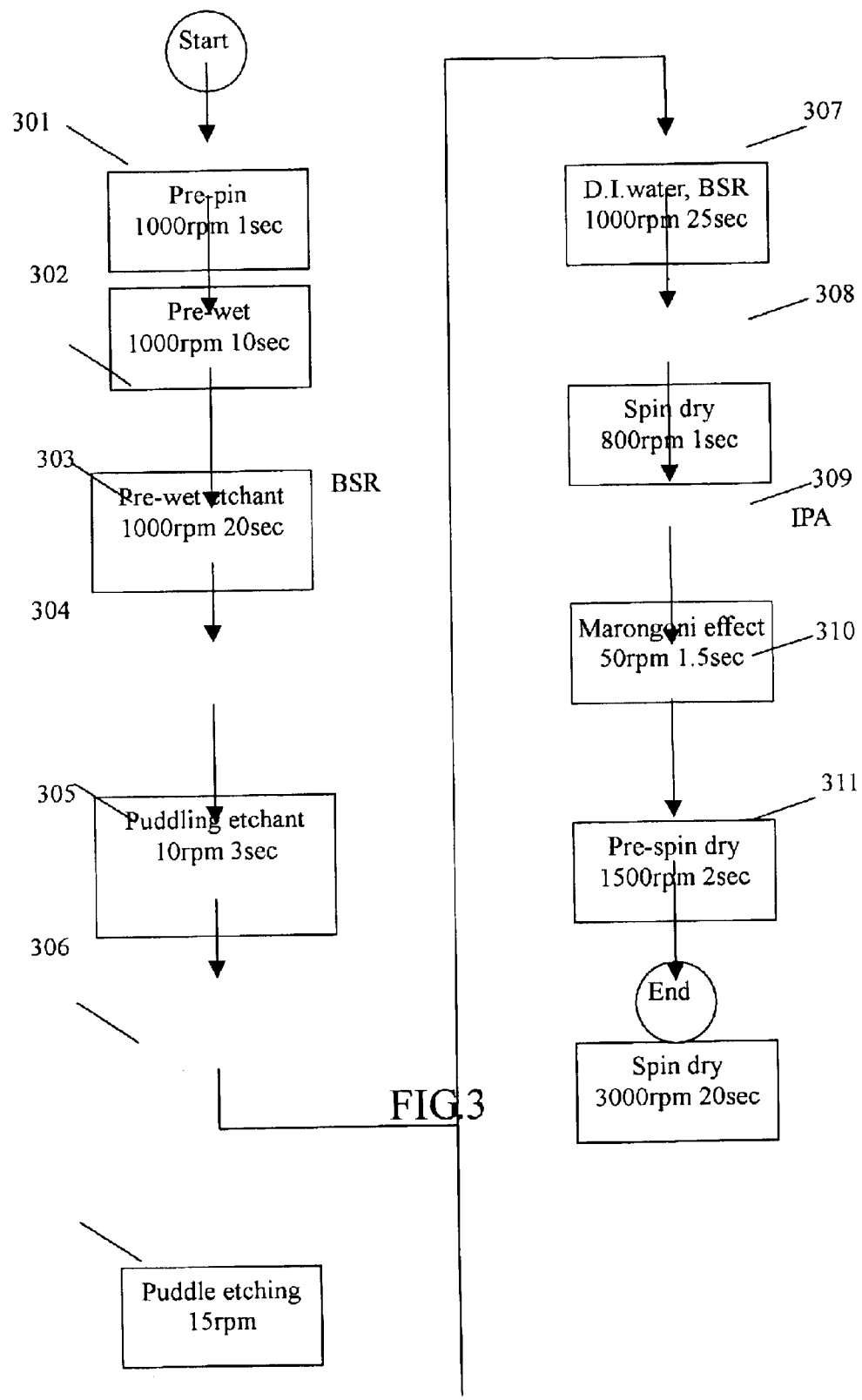
FIG. 3 is a flow chart of puddle etching.

The first embodiment of the present invention made use of etching silicon dioxide as an example. As the flow chart in FIG. 3, which explain the process of puddle etching. In step 301, load a wafer into a spin processor and spin with speed of 800–1200 rpm. In step 302, inject D.I, water and spin at a speed of 800–1200 rpm to pre-wet the wafer. In step 303, inject etching solution from the front side injection pipe 10 and back side rinse (BSR) with an injection rate of 600 cc/min and spin with 800–1200 rpm to remove the thin film on the surface and the photo-resist on the back-side of the wafer for 10–20 min., the speed may not be too low such that the photo-resist can carry out the particles on the wafer. In step 304, keep the wafer spin at a speed of 800–1200 rpm, stop supply etching solution to spin off the etching solution on the wafer for 1 sec. In step 305, the speed is slow down to 0–50 rpm, form puddle of etching solution by injected etching solution, the flow rate is 0.6–5 L/min for 3 sec., the quantity of etching solution is depend on the size of the wafer, larger wafer need more solution, the spin speed of the wafer is kept in 0–50 rpm to keep the solution stay on the wafer, too fast may loose part of the solution, but without spin may result non-uniformity; In step 306, which is the key point of the present invention, stop injection of etching solution, keep the wafer spin with 0–50 rpm, the better is 15 rpm, this speed depend on the kind of thin film and the viscosity of the etching solution, to keep the solution not fry away from the wafer, but may not stop spinning, and should be spin slowly to keep the solution stay on the wafer uniformly to perform puddle etching, the etching time is depend on the thickness of the thin film. Then in step 307, speed up to 800–1200 rpm, inject D.I. water from the front side and BSR to rinse the wafer for 20–25 sec. In step 308, stop supplying D.I. water on both the front side and BSR, pre-spin with 600–1000 rpm for 1 sec. to spin off the D.I. water. In step 309, inject IPA, the speed is slow down to 40–100 rpm for 1.5 sec. by using Marangoni effect to make the wafer more clean, multiple of little water ball can be seen on the wafer and can be spin off by centrifugal force, In step 310, speed up to 1000–2000 rpm for 2 sec. to pre-dry the wafer. Finally, in step 311, speed up to 3000 rpm or more for 20 sec, to dry the wafer completely. The wafer then is moved out of the processor and the etching step is completed.

Table 1 is the etching uniformity by using puddle etching. Table 2 is the etching uniformity by using spin etching of the prior art. From Table 1, the $3\sigma$ uniformity is 2.3% for puddle etching, which is better than the $3\sigma$ uniformity of 5.54% for spin etching in Table 2. More ever, the etch rate of 33.5 A/min for puddle etching is a little faster than 28.6 A/min for spin etching. It is obvious that the etching solution have enough time to contact with the thin film for puddle etching, however, for spin etching, there is no enough time for the etching solution to react with the thin film, so the etch rate is slower. Compare test wafer A (spin etch, 600 rpm) and test wafer B (spin etch 1000 rpm) in Table 2, which show that higher speed can not improve the uniformity, but intended to become worse and the etch rate is almost the same.

TABLE 1

The uniformity and etch rate obtained from puddle etching

| | |
|---|---|
| Uniformity ($3\sigma$) | 2.296% |
| Uniformity (max. to min.) | 1.413% |
| Etch rate | 33.46 Å/min |

TABLE 2

The uniformity and etch rate obtained from spin etching

| | Test-wafer A 600 rpm | Test-wafer B 1000 rpm |
|---|---|---|
| Uniformity ($3\sigma$) | 5.45% | 4.09% |
| Uniformity (max. to min.) | 2.61% | 3.26% |
| Etch rate | 28.6 Å/min | 28.5 Å/min |

In this embodiment of the present invention, the consumption of the etching solution in step 3 and 5 of the flow chart is totally 23 sec.×600 cc/min.=23 sec.×10 cc/sec.=230 cc. However, large volume of etching solution is needed in spin etching (depend on the thickness of the film to be etched), for example, the time for etching 1000A of silicon dioxide is 1000 A/28 A/min=36 min., the etching solution require is 36 min×600 cc/min=21,600 cc, which is 1000 time as compare to puddle etching. This is not only increasing the cost of etching solution, but also increasing the cost of wasted-water treatment. Therefore, puddle etching has two additional advantages: environment protection and cost down.

The above described embodiment intended to illustrate the present invention, not to limit the scope of the present invention, various embodiments and changes can be made thereto without departing the broad spirit and scope of the invention, or application on other device etching within the meaning of an equivalent of the claims of the invention and within the claims are to be regarded to be in the scope of the present invention.

What is claimed is:

1. A thin film puddle etching method, comprising the steps of:

(a) Loading a wafer into a spin processor and spin at a speed of 800–1200 rpm;

(b) Injecting D.I. water therein, spin at a speed of 800–1200 rpm to pre-wet the wafer;

(c) Injecting etch solution from the front side and back side rinse (BSR) with a first injection rate and spin with 800–1200 rpm to remove the thin film on the surface of the wafer for 10–20 min;

(d) Keeping the wafer spin at a speed of 800–1200 rpm, stop supply etching solution to spin off the etching solution on the wafer;

(e) Injecting and forming puddle of etching solution with a first flow rate and at a first spin speed;

(f) Stop injection of etching solution, perform puddle etching at a second spin speed;

(g) Speed up to 800–1200 rpm, inject D.I. water from the front side and BSR to rinse the wafer;

(h) Stop supplying D.I. water on both the front side and BSR, pre-spin with 600–1000 rpm to spin off the D.I. water;

(i) Injecting IPA, the speed is slow down to 40–100 rpm to spin off the water by Marangoni effect;

(j) Speed up to 1000–2000 rpm to pre-dry the wafer;

(k) Speed up to 3000 rpm or more to dry the wafer completely;

The method is characterized by:

(A) After pre-wet the wafer in step (b), step (c) is then performed: inject etching solution from the front side and back side rinse (BSR) with a first injection rate and spin with 800–1200 rpm to remove the thin film on the surface of the wafer for 10–20 min;

(B) After removing the etching solution in step (d), step (e) is then performed: injecting and forming puddle of etching solution with a first flow rate and at a first spin speed;

(C) After forming puddle of etching solution in step (e), step (f) is then performed: perform puddle etching at a second spin speed.

2. A thin film puddle etching method according to claim 1, wherein the thickness removed from the surface of the thin film is 5 A-200 A.

3. A thin film puddle etching method according to claim 1, wherein the first spin speed is 0–50 rpm such that the etch solution will not leaving the wafer.

4. A thin film puddle etching method according to claim 1, wherein the first flow rate is 0.6–5 l/min.

5. A thin film puddle etching method according to claim 1, wherein the second spin speed is 0–50 rpm such that the etch solution will not leaving the wafer.

6. A thin film puddle etching method according to claim 1, wherein when performing step (e) and (f), a shelter is needed over the wafer to prevent turbulence from the HEPA or air flow.

* * * * *